United States Patent
Ge et al.

(10) Patent No.: US 9,927,473 B2
(45) Date of Patent: Mar. 27, 2018

(54) METHOD FOR CHECKING AN EXCITING CURRENT OF A SYNCHRONOUS MACHINE IN GENERATOR OPERATION

(71) Applicant: ROBERT BOSCH GMBH, Stuttgart (DE)

(72) Inventors: Jie Ge, Stuttgart-Hausen (DE); Paul Mehringer, Stuttgart (DE)

(73) Assignees: ROBERT BOSCH GMBH, Stuttgart (DE); SEG AUTOMOTIVE GERMANY GMBH, Stuttgart (DE)

( * ) Notice: Subject to any disclaimer, the term of this patent is extended or adjusted under 35 U.S.C. 154(b) by 450 days.

(21) Appl. No.: 14/387,806

(22) PCT Filed: Mar. 20, 2013

(86) PCT No.: PCT/EP2013/055767
§ 371 (c)(1),
(2) Date: Sep. 24, 2014

(87) PCT Pub. No.: WO2013/143929
PCT Pub. Date: Oct. 3, 2013

(65) Prior Publication Data
US 2015/0091606 A1   Apr. 2, 2015

(30) Foreign Application Priority Data

Mar. 26, 2012 (DE) .......... 10 2012 204 751

(51) Int. Cl.
*G01R 31/34* (2006.01)
*G01R 25/00* (2006.01)
(Continued)

(52) U.S. Cl.
CPC .......... *G01R 25/00* (2013.01); *G01R 31/343* (2013.01); *G01R 35/00* (2013.01); *H02P 9/48* (2013.01);
(Continued)

(58) Field of Classification Search
CPC .............. G01R 1/06766; G01R 31/343; G01R 19/2513; G01V 3/083; G01N 35/00871; G01N 22/02
(Continued)

(56) References Cited

U.S. PATENT DOCUMENTS 4,413,222 A    11/1983   Gansert et al.
6,979,975 B1 *  12/2005   Kinpara .............. G01P 3/44
                                                    318/400.02
(Continued)

FOREIGN PATENT DOCUMENTS

CN    1185678 A    6/1998
CN    1287710 A    3/2001
(Continued)

*Primary Examiner* — Melissa Koval
*Assistant Examiner* — Trung Nguyen
(74) *Attorney, Agent, or Firm* — Norton Rose Fulbright US LLP; Gerard Messina

(57) ABSTRACT

The method includes operating the synchronous machine in idle operation; recording a phase voltage measured value of the synchronous machine; ascertaining a phase voltage expected value by allocating stored characteristics map values for the phase voltage, for the exciting current and the recorded rotational speed of the synchronous machine; and comparing the phase voltage expected value to the phase voltage measured value. Also described is a diagnostic device for carrying out this method, as well as a corresponding computer program product.

9 Claims, 4 Drawing Sheets

(51) Int. Cl.
    *G01R 35/00*     (2006.01)
    *H02P 9/48*     (2006.01)
    *G01R 1/20*     (2006.01)
    *G01R 31/28*     (2006.01)
    *H02P 29/024*     (2016.01)

(52) U.S. Cl.
    CPC .......... *G01R 1/203* (2013.01); *G01R 31/2829* (2013.01); *H02P 29/0241* (2016.02)

(58) Field of Classification Search
    USPC ... 324/600, 500, 765.01, 540–547, 160–170, 324/145, 137, 154 R, 521, 617, 622, 650
    See application file for complete search history.

(56) References Cited

U.S. PATENT DOCUMENTS

| | | | |
|---|---|---|---|
| 2005/0049770 A1 | | 3/2005 | Liu et al. |
| 2005/0104582 A1* | | 5/2005 | Toyozawa ................ H02P 1/46 |
| | | | 324/207.25 |
| 2007/0085511 A1 | | 4/2007 | Uematsu et al. |
| 2007/0085512 A1 | | 4/2007 | Maehara |

FOREIGN PATENT DOCUMENTS

| | | |
|---|---|---|
| CN | 1516918 A | 7/2004 |
| DE | 199 29 060 | 10/2000 |
| DE | 102005012052 | 10/2000 |
| DE | 10 2009 002115 | 10/2010 |

* cited by examiner

METHOD FOR CHECKING AN EXCITING CURRENT OF A SYNCHRONOUS MACHINE IN GENERATOR OPERATION

FIELD OF THE INVENTION

The present invention relates to a method for checking an exciting current (field current) measurement of a synchronous machine in a generator operation.

BACKGROUND INFORMATION

Generators are used in motor vehicles for converting mechanical energy into electrical energy. Most of the generators used for this purpose in motor vehicles are synchronous generators configured as claw pole generators.

In hybrid drive technology for motor vehicles, synchronous machines are also operated in motor operation in order to start the internal combustion engine of the hybrid drive system. For this purpose, the synchronous machine may be configured as a belt-driven starter generator (BSG) for the start/stop operation. Such a starter machine is usually operated as a motor only at very low engine speeds because the torque that is able to be generated drops rapidly over the engine speed. In order to increase the output, modified synchronous machines are operated in a 48V vehicle electrical system.

Conventional generators such as synchronous generators configured as claw pole generators have a generator regulator or a current regulator which regulates the exciting current in order to set the power output of the generator. The checking of a current sensor for measuring the exciting current is not provided. However, during the transition to a 48V vehicle electrical system it must be ensured for safety reasons, due to the higher torque output in a motor operation of the synchronous machine, that an unintended torque output due to incorrect exciting current measurements are prevented in a reliable manner, for the synchronous machine is normally used in a boost-recuperation system at a much higher output, both in a motor and a generator operation, which causes clearly higher brake torques or propulsive forces to be generated.

A device is known from US publication 2007/0085512 A1, for controlling the voltage of a generator, which includes an arithmetic unit which includes a functionality for correcting the exciting current. This is done on the basis of the current flow into an electrical load to which the voltage of the generator is applied, and on the basis of the output current of the generator calculated on the basis of the exciting current.

Patent document U.S. Pat. No. 4,413,222 discusses a battery charging system which has an alternating current generator (10), a voltage regulator (20), and a charge control device for indicating malfunctions. This device is connected to a signaling device (82) for detecting the switching state of the voltage regulator, a first threshold stage (67) for detecting a minimum value of the generator voltage and a second threshold stage (69) for detecting a voltage that is above the regulation setpoint value by a specific value at a sensing point of the system. The one input of the first threshold stage (67) is connected to a fault detection connection (D+), which is decoupled from the battery voltage, at the exciting system (12, 14) of the generator. The second threshold stage (69) is connected on the input side to a sensing point that is affected by the battery voltage. This has the advantage that the first threshold stage (67) is able to record and evaluate the generator voltage in an unbiased manner, unaffected by the charge state of the battery, and the second threshold stage.

SUMMARY OF THE INVENTION

Therefore, it is an object of the present invention to provide a method and a diagnostic device, as well as a computer program product, that make it possible to check the exciting current measurement of a synchronous machine in a generator operation at a low expenditure.

The present invention is based on the recognition that checking a current sensor for an exciting current measurement is possible by comparing phase voltage measured values, which may be measured in an idling operation, to a phase voltage expected value ascertained from corresponding characteristics map values, in those instances in which the exciting current is regulated as a function of the power output of the synchronous machine in generator operation. If the comparison indicates that a deviation has occurred, a fault signal is generated for the further processing. This fault signal may include additional information with regard to the cause of the fault, such as that the cause of the fault is a winding short circuit of a winding of the synchronous machine.

According to one aspect, the present invention relates to a method for checking a current sensor for an exciting current measurement of a synchronous machine in a generator operation featuring a regulated exciting current. In a first step, the synchronous machine is operated as a generator in an idling operation. This step is carried out whenever a checking of the current sensor is to take place. This may be the case within fixed time intervals or may take place due to an internally generated or an external checking signal. The idling operation can be achieved in that, for example, the exciting current of the synchronous machine is reduced in a generator operation starting from a normal operating state, until a battery current that is charging a battery is equal to zero or virtually equal to zero, i.e., the battery is no longer being charged, so that with the achievement of the idling operation, the battery could be separated from the synchronous machine by disconnecting it. In this context, the reducing may take place continuously or step-by-step, the step width in a stepwise reduction being able to be of equal size or being adaptively adjusted.

In one advantageous specific embodiment, a measured value of a phase voltage of the synchronous machine is recorded. The measured value of the phase voltage is measured during the generator operation, e.g., by a voltage sensor, between a stator winding or phase of the synchronous machine and the mass that represents the virtual star point of the stator windings. The measured value of the phase voltage may be a single measured value or the curve over time of the measured value of the phase voltage within a specified time interval in the form of a data set, which is further evaluated afterwards, for instance, in order to determine a peak or maximum value of the curve of the voltage.

In one advantageous specific embodiment, the expected value of the phase voltage is ascertained by allocating stored characteristic map values for the phase voltage, for the exciting current, and the rotational speed of the synchronous machine. That is, values for the phase voltage, the exciting current and the rotational speed of the synchronous machine during generator operation are available in the form of a characteristics map. Using the recorded exciting current and the recorded rotational speed in the idle operation, the expected value of the phase voltage is thus determined by a comparison with the values in the form of a characteristics map, by allocation, which value would be expected in a fault-free exciting current measurement.

In one advantageous specific embodiment, the expected value of the phase voltage is compared to the measured value of the phase voltage. If a deviation is present, a fault signal may be produced for further processing.

In one advantageous specific embodiment, the stored characteristics map values for the phase voltage, the exciting current and the rotational speed of the synchronous machine are ascertained prior to the initial start-up when the synchronous machine is idling. Thus, the ascertainment is able to take place prior to the initial operation at the end of the assembly line, by calibration of the current sensor. To do so, values for the phase voltage or their curve over time, the rotational speed and the exciting current are recorded without connected battery, i.e., in an idling operation, and written into a non-volatile memory in the form of a characteristics map. However, characteristic maps values may alternatively also be recorded once for a plurality of units such as diagnostic devices or computer program products and then be used multiple times, i.e., it is not invariably the case that values for the phase voltage or their curve over time, the rotational speed and the exciting currents are recorded and written into the memory.

In order to consider natural fluctuations of measured values and to thereby exclude incorrect fault reports by an overly precise measurement, it is provided in one advantageous specific embodiment to form a monitoring window having a lower and an upper boundary value for the expected value of the phase voltage. The lower and upper boundary value can be fixedly specified, or they are determined with the aid of a percentage indication using the expected value of the phase voltage. Finally, the lower and the upper boundary value are also determinable from the curve over time of the phase voltage, such as with the use of statistical methods.

In one advantageous specific embodiment, the accuracy in the fault detection can be increased if varying, non-linear parameters of the synchronous machine and/or aging effects of the synchronous machine are taken into account when determining the lower and an upper boundary value of the monitoring window. Such varying, non-linear parameters or aging effects may have been determined by, for instance, an intelligent statistical offset-valuation with regard to the characteristics map or by corresponding measurements and likewise be stored in the characteristics map.

In one advantageous specific embodiment it is provided that the recording of the measured value of the phase voltage includes an analog/digital conversion of measured values for the phase voltage. This simplifies the processing of the measured values, and particularly the evaluation of a curve over time of a phase voltage of the synchronous machine.

According to a further aspect, the present invention relates to a diagnostic device for checking a current sensor for an exciting current measurement of a synchronous machine in generator operation having a regulated exciting current, having a control device for operating the synchronous machine in idling operation, an input interface which is connected to a voltage sensor for transmitting a measured value of a phase voltage, and which is connected to a current sensor for transmitting a measured value for the exciting current, and which is connected to a rotational speed sensor for transmitting a measured value for the rotational speed, a memory in which characteristics map values for the phase voltage, the exciting current and the rotational speed of the synchronous machine are stored, an ascertainment device which is connected to the input interface for reading in the measured values for the exciting current and the measured values for the rotational speed, and which is connected to the memory for reading out the characteristics map values, in order to ascertain an expected value of the phase voltage by allocating characteristic map values for the phase voltage, the exciting current and the rotational speed of the synchronous generator stored in the memory, and a comparator device which is connected to the input interface for transmitting the measured value of the phase voltage, and having the ascertainment device for reading in the expected value of the phase voltage, in order to compare the expected value of the phase voltage to the measured value of the phase voltage.

The components mentioned of the diagnostic device may be configured as hardware components, as software components or as a combination of hardware and software components. They are configured to carry out the steps of the method according to the present invention.

In one advantageous specific embodiment, characteristics map values for the phase voltage, the exciting current and the rotational speed of the synchronous machine are stored in the memory, which were ascertained prior to the initial start-up while the synchronous machine was idling in generator operation. This may, as was already described, take place prior to the initial operation at the end of the assembly line, by calibration of the current sensor.

In one advantageous specific embodiment it is provided that the ascertainment device be configured for forming a monitoring window having a lower and an upper boundary value for the expected value of the phase voltage. As was mentioned before, the lower and the upper boundary value may be fixedly specified, or they are determined with the aid of a percentage indication while using the expected value of the phase voltage by the ascertainment device. Finally, the ascertainment device may also be configured to determine the lower and the upper boundary value from the curve over time of the phase voltage, taking into account the aging effect, for instance, using statistical methods.

In one advantageous specific embodiment it is provided that the ascertainment device have an analog/digital converter for the analog/digital conversion of measured values for the phase voltage, which, as mentioned before, simplifies the processing of the measured values and particularly the evaluation of a curve over time of a phase voltage of a synchronous machine.

According to one further aspect, the present invention relates to a computer program product, which is able to be loaded into a program memory, having program commands, of a microcontroller, in order to carry out all the steps of the method according to the present invention, especially when the computer program product is run on a diagnostic device according to the present invention.

The present invention, without additional hardware expenditure, enables the checking of a current sensor for an exciting current measurement, by comparing phase voltage measured values, which were measured in an idling operation, with a phase voltage expected value ascertained from corresponding characteristics map values when the exciting current is regulated as a function of the power output of the synchronous machine in generator operation.

DETAILED DESCRIPTION

Figure 1:
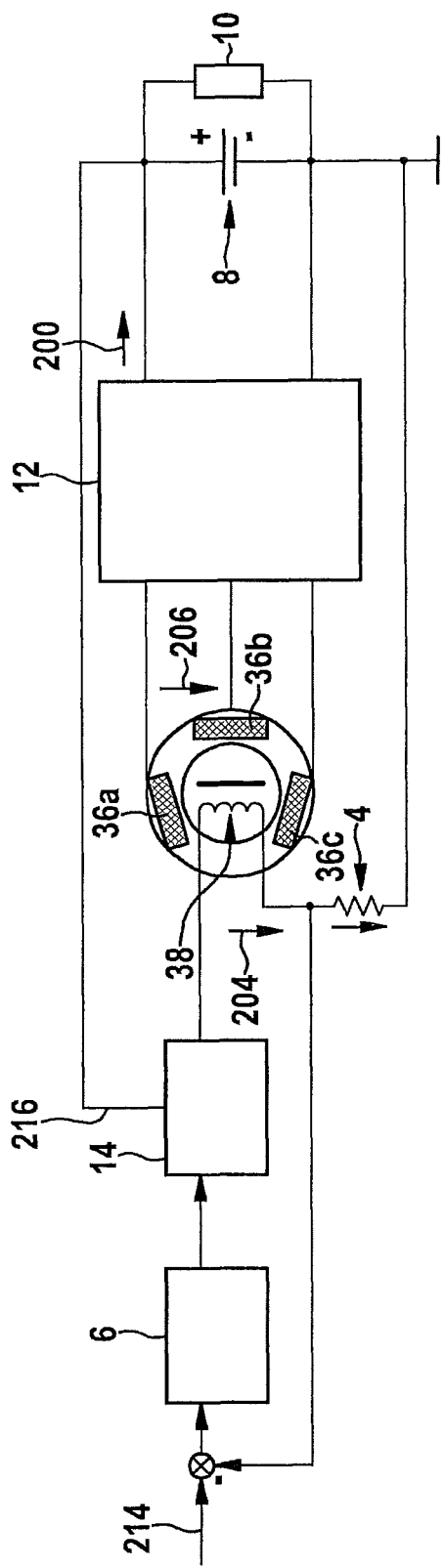
FIG. 1 shows a schematic representation of a regulating structure of a synchronous machine in generator operation.

FIG. 1 shows a synchronous machine 2, which, in the present exemplary embodiment, has three phases or rather stator windings 36a, 36b, 36c, and is operated, at least intermittently, in generator operation, and is connected on the output side to an inverter 12 which rectifies the three-phase alternating current generated by the synchronous machine 2 or the phase voltage 206 generated, in order thus to supply a battery 8 and a load 10, that is connected in parallel to battery 8, with electric power in the form of a battery current 200.

On the input side, synchronous machine 2 is acted upon by an exciting current 202, which flows through an exciting winding 38 of synchronous machine 2, and produces a voltage drop in the exciting voltage 204 there. The magnitude of exciting current 202 is recorded using a current sensor 4.

Current sensor 4 is in connection with an input to a current regulator 6, in such a way that the value of exciting current 202 recorded using current sensor 4 is subtracted from a setpoint exciting current 214.

From this difference of the setpoint exciting current 214 and the value for exciting current 202 recorded by current sensor 4, current regulator 6 ascertains a controlled variable which is supplied to a PWM output stage 14, which pulse-width modulates exciting current 202. Furthermore, battery voltage 216 is supplied to PWM output stage 14, which is present at battery 8 and load 10 that is connected in parallel to it. In addition, a voltage sensor (not shown) is provided for recording a phase voltage measured value 206 between a phase or stator winding 36a, 36b or 36c and the mass or the virtual star point of synchronous machine 2 and a rotational speed sensor (not shown) for recording the rotational speed of synchronous machine 2.

In normal operation, in which battery 8 is charged with electric power, an exciting current 202 is set by pulse-width modulation by specifying a value for setpoint exciting current 214 and by the effect of current regulator 6 as well PWM output stage 14, and this current at a given rotational speed 212 of synchronous machine 2 leads to a phase voltage 206 and, with that, after rectification by inverter 12, to a battery voltage 200, which gives rise to the charging of battery 8 with electric power and/or to power output at load 10.

Figure 2:
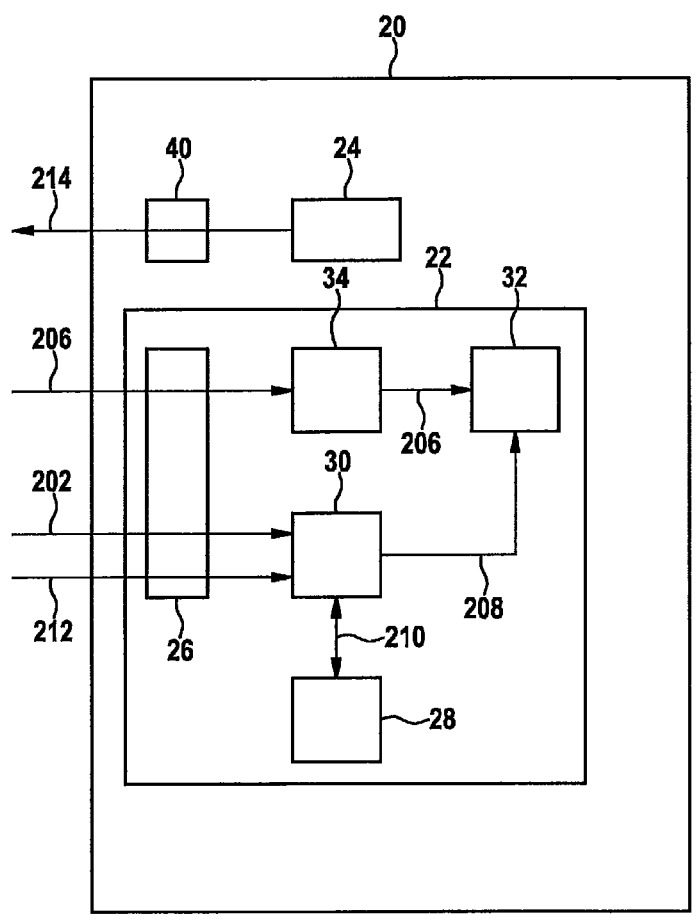
FIG. 2 shows a schematic representation of an exemplary embodiment of a diagnostic device according to the present invention.

FIG. 2 shows a diagnostic device 20, which has a microcontroller 22 and a control device 24. Control device 24 is connected via an output interface 40 to the input of current regulator 6 in such a way that a value for setpoint exciting current 214 is able to be transmitted by control device 24. In this context, control device 24 is configured in such a way that, within fixed time intervals, or based on an internally generated or external checking signal, starting from a exciting current 202 in normal operation, it reduces the magnitude of exciting current 202 to the extent that no further electric charging of battery 8 with electric power takes place, i.e. battery current 200 is equal to zero or nearly equal to zero. In this context, by a "nearly equal to zero" battery current one should understand an electric current whose magnitude is 1% to 5% of battery current 200 in normal operation. If battery current 200 is equal to zero or nearly equal to zero, synchronous machine 2 is being operated in a state that is designated below as idling operation. Starting from normal operation, idling operation is able to be achieved in that control device 24 reduces exciting current 202 of synchronous machine 2 in generator operation continuously or step-wise, the step sizes in a step-wise reduction being either of the same size or being adaptively adjusted. In deviation from the representation of the present exemplary embodiment in FIG. 2, control device 24 may also be a part of microcontroller 22.

Microcontroller 22 has an input interface 26, a memory 28, an ascertaining device 30, a comparator device 32 and an analog/digital converter 34.

Ascertaining device 30 and analog/digital converter 34 are connected to input interface 26, in such a way that analog/digital converter 34 is able to have a phase voltage measured value 206 supplied to it measured using the voltage sensor (not shown). By contrast, exciting current 202 recorded using current sensor 4 (see FIG. 1) and rotational speed 212 recorded using the rotational speed sensor (not shown) are able to be supplied to ascertaining device 30 via input interface 26.

Ascertaining device 30 is in a connection, suitable for data exchange, with a memory 28, which is nonvolatile in the present exemplary embodiment. Thus, ascertaining device 30 has access to data stored in memory 28, which are stored in the form of characteristics map values 210 and include a plurality of values for the phase voltage, the exciting current and the rotational speed of the synchronous machine. Because of this access, ascertaining device 30 is able to determine a phase voltage expected value 208 from the values for exciting current 202 and rotational speed 212 transmitted via input interface 26.

Phase voltage expected value 208 is then able to be supplied to comparator device 32 via a further suitable connection, and to the latter, via additional, suitable connections, there may also be supplied phase voltage measured value 206 digitized by analog/digital converter 34.

It should be noted that the connections named may be of a permanent nature, that is, permanently wired, or be of only a temporary nature, e.g. exist only intermittently within a bus system for data exchange.

Comparator device 32 compares phase voltage measured value 206 to phase voltage expected value 208. For this purpose, comparator device 32 is configured to form a monitoring window for phase voltage expected value 208 having a lower and an upper boundary value. For this purpose, the lower and the upper boundary value can be specified fixedly to comparator device 32. Comparator device 32 alternatively determines the lower and the upper boundary value, with the aid of a percentage indication, using phase voltage expected value 208. Comparator device 32 is further configured so that, when the comparison shows that phase voltage measured value 206 lies within the value interval between the lower and the upper boundary value, it is not to generate a fault signal, but is to generate a fault signal if phase voltage measured value 206 lies outside this value interval.

Figure 3:
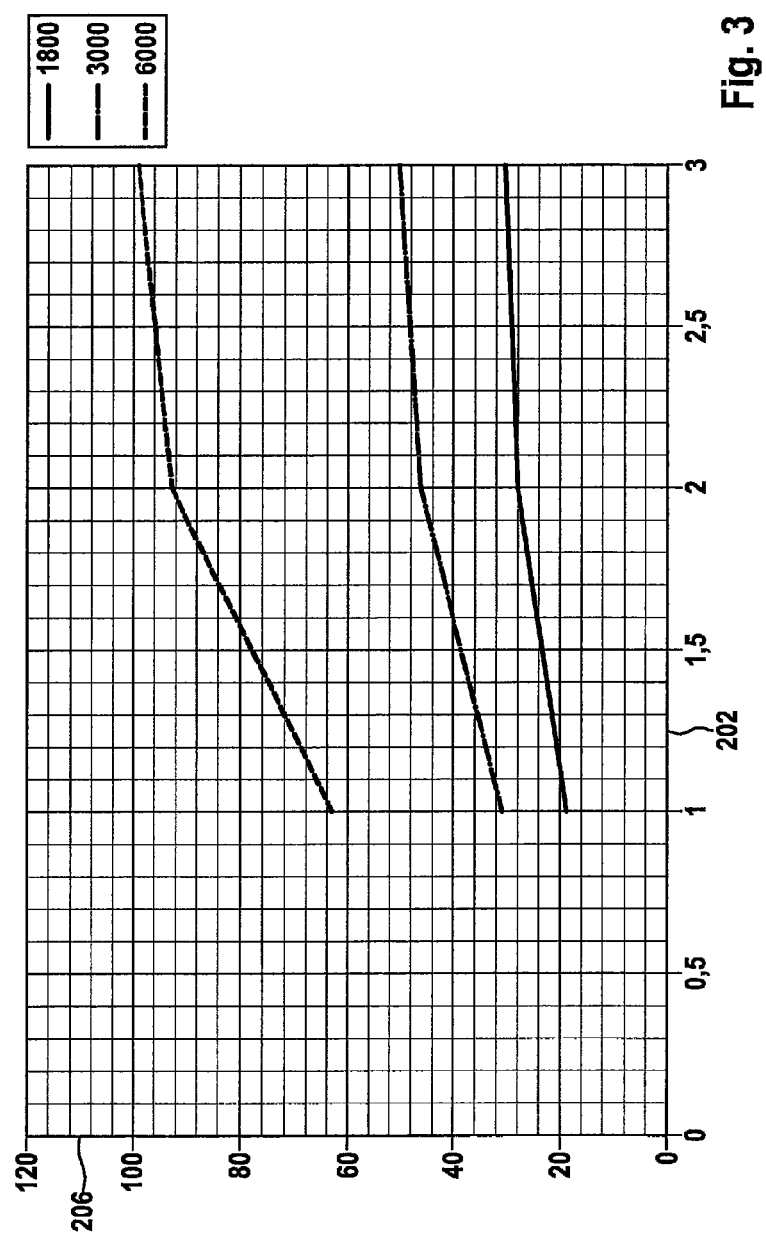
FIG. 3 shows a schematic representation of the interrelationship of the idling voltage, the exciting current and the rotational speed.

FIG. 3 shows as an example of the interrelationship of exciting current 202, rotational speed 212 having values 1800 n/min, 3000 n/min and 6000 n/min, and phase voltage measured value 206 of a synchronous machine 2 in generator operation, having separate excitation at idling. As may be seen in FIG. 3, use at low exciting currents 202 and low rotational speeds 212 may be used, particularly in the idling case. The temperature dependence of the resistances of the phases or stator windings 32a, 32b, 32c has no influence particularly in the idling case, since battery current 200 is held equal to zero or nearly equal to zero.

Figure 4:
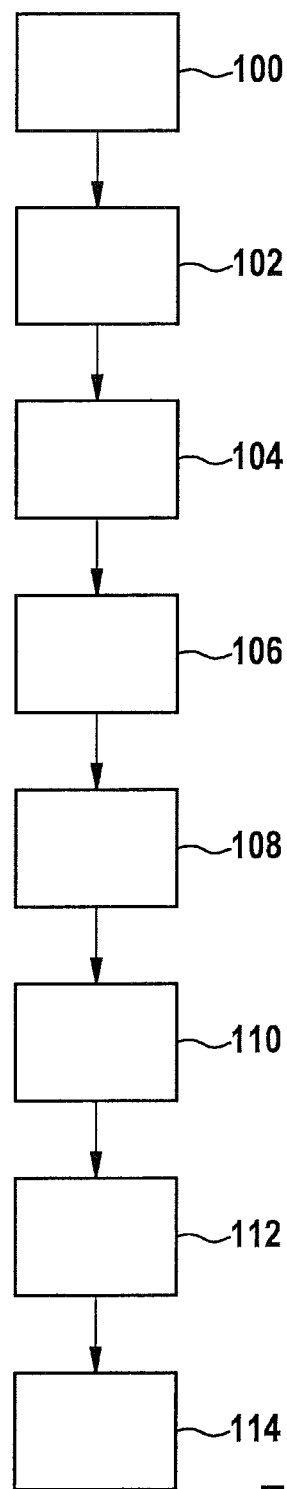
FIG. 4 shows a schematic representation of a flow chart of an exemplary embodiment of a method according to the present invention.

The method sequence will be explained below, with reference to FIG. 4.

In step 100, before the initial start-up, characteristics map values are taken up, by calibration of current sensor 4, for the phase voltage or its curve over time, the exciting current and the rotational speed of synchronous machine 2 without connected battery 8 or load 10, and written in the form of characteristics map values 210 into nonvolatile memory 28.

The actual checking of current sensor 4 may take place within fixed time intervals. Alternatively, the checking may also be triggered based on internally generated or external checking signals. For this purpose, in a further step 102, exciting current 202 is reduced by control device 24 to the extent that battery current 200 is equal to zero or nearly equal to zero. Now synchronous machine 2 is operated in idling operation, in which battery 8 is no longer being charged.

In the following step 104, the phase voltage is now measured. This step 104 includes recording the curve over time of the phase voltage within a time interval, that is, the recording of a plurality of values in temporal sequence in the form of a data set, as well as an evaluation, in order to determine from the essentially sinusoidal curve a maximum value, in order thus to determine phase voltage measured value 206. For this, the values are digitized previously by analog/digital converter 34 and correspondingly evaluated by comparator device 32.

In the following step 106, exciting current 202 and rotational speed 212 are then recorded by ascertaining device 30.

In subsequent step 108, ascertaining device 30 accesses characteristics map values 210, that are stored in memory 28, for the phase voltage, the exciting current and the rotational speed, in order to ascertain a corresponding value, with the aid of the values for exciting current 202 and rotational speed 212, which then forms phase voltage expected value 208 which would set in response to the correct recording of exciting current 202.

In the following step 110, ascertaining device 30 determines the monitoring window having the lower and the upper boundary value with the aid of the percentage indication or the percentage value by corresponding multiplication, using phase voltage expected value 208.

At this point it should be noted that step 104 is also able be carried out after one of steps 106 through 110.

In the following step 112, comparator device 32 carries out a comparison between phase voltage expected value 208 and phase voltage measured value 206, in order to determine whether phase voltage measured value 206 lies within or outside or within the value interval between the lower and the upper boundary value.

In further step 114, a fault signal is generated if phase voltage measured value 206 lies outside this value interval. In this context, the fault signal may include information on the cause of the fault, such as an interwinding fault in one of the phases or stator windings 32a, 32b, 32c or in exciting winding 38, or an interwinding fault of the stator winding between output terminals B+ or B− (both not shown).

What is claimed is:

1. A method for checking a current sensor for an exciting current measurement of a synchronous machine in generator operation having a regulated exciting current, the method comprising:

operating the synchronous machine in idling operation of the synchronous machine;

recording a phase voltage measured value of the synchronous machine during idling of the synchronous machine, and recording the exciting current;

ascertaining a phase voltage expected value by allocating stored characteristics map values for the phase voltage, for the recorded exciting current, and for the recorded rotational speed of the synchronous machine; and comparing the phase voltage expected value to the phase voltage measured value;

wherein, when the comparison shows that the phase voltage measured value lies within the value interval between a lower and an upper boundary value, no fault signal is generated, and a fault signal is generated if the phase voltage measured value lies outside this value interval.

2. The method of claim 1, wherein the stored characteristics map values for the phase voltage, the exciting current and the rotational speed of the synchronous machine are ascertained before the initial start-up during idling of the synchronous machine.

3. The method of claim 1, wherein a monitoring window is formed, having a lower and an upper boundary value, for the phase voltage expected value.

4. The method of claim 1, wherein recording the phase voltage measured value includes an analog/digital conversion of measured values for the phase voltage.

5. A diagnostic device for checking a current sensor for an exciting current measurement of a synchronous machine having a regulated exciting current, comprising:

a control device for operating the synchronous machine in an idling operation of the synchronous machine;

an input interface, which is connected to a voltage sensor for transmitting a phase voltage measured value, ascertained during idling of the synchronous machine and which is connected to a current sensor for transmitting a measured value for the exciting current, and which is connected to a rotational speed sensor for transmitting a measured value for the rotational speed;

a memory, in which characteristics map values for the phase voltage, the exciting current and the rotational speed of the synchronous machine are stored;

an ascertaining device, which is connected to the input interface for reading in the measured values for the exciting current and the measured values for the rotational speed, and which is connected to the memory for reading out the characteristics map values, to ascertain a phase voltage expected value by allocating characteristics map values stored in the memory for the phase voltage, for the exciting current and for the rotational speed of the synchronous machine; and a comparator device, which is connected to the input interface for transmitting the phase voltage measured value, and is connected to the ascertaining device for reading in the phase voltage expected value, to compare the phase voltage expected value to the phase voltage measured value;

wherein, when the comparison shows that the phase voltage measured value lies within the value interval between a lower and an upper boundary value to generate no fault signal, and to generate a fault signal if the phase voltage measured value lies outside this value interval.

6. The diagnostic device of claim 5, wherein the characteristics map values are stored in the memory for the phase voltage, the exciting current and the rotational speed of the synchronous machine which were ascertained before the initial start-up during idling of the synchronous machine.

7. The diagnostic device of claim 5, wherein the ascertaining device is configured to form a monitoring window having a lower and an upper boundary value for the phase voltage expected value.

8. The diagnostic device of claim 5, wherein the ascertaining device has an analog/digital converter for the analog/digital conversion of the measured values for the phase voltage.

9. A non-transitory computer readable medium having a computer program, which is executable by a processor, comprising:
  a program code arrangement having program code for checking a current sensor for an exciting current measurement of a synchronous machine in generator operation having a regulated exciting current, by performing the following:

operating the synchronous machine in idling operation of the synchronous machine;
recording a phase voltage measured value of the synchronous machine (2) during idling of the synchronous machine, and recording the exciting current;
ascertaining a phase voltage expected value by allocating stored characteristics map values for the phase voltage, for the recorded exciting current and for the recorded rotational speed of the synchronous machine; and
comparing the phase voltage expected value to the phase voltage measured value;
wherein, when the comparison shows that the phase voltage measured value lies within the value interval between a lower and an upper boundary value, no fault signal is generated, and a fault signal is generated if the phase voltage measured value lies outside this value interval.

* * * * *